(12) United States Patent
Ogata

(10) Patent No.: US 11,315,766 B2
(45) Date of Patent: Apr. 26, 2022

(54) PLASMA PROCESSING APPARATUS AND METHOD FOR MEASURING THICKNESS OF RING MEMBER

(71) Applicant: TOKYO ELECTRON LIMITED, Tokyo (JP)

(72) Inventor: Atsushi Ogata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 148 days.

(21) Appl. No.: 16/590,953

(22) Filed: Oct. 2, 2019

(65) Prior Publication Data
US 2020/0111648 A1 Apr. 9, 2020

(30) Foreign Application Priority Data

Oct. 3, 2018 (JP) .............................. JP2018-188372

(51) Int. Cl.
| | | |
|---|---|---|
| *H01J 37/32* | (2006.01) | |
| *H01L 21/683* | (2006.01) | |
| *H01L 21/67* | (2006.01) | |

(52) U.S. Cl.
CPC ............... *H01J 37/32642* (2013.01); *H01J 37/32715* (2013.01); *H01L 21/67069* (2013.01); *H01L 21/67253* (2013.01); *H01L 21/6833* (2013.01); *H01J 2237/24571* (2013.01); *H01J 2237/3343* (2013.01)

(58) Field of Classification Search
CPC ........... H01J 37/32642; H01J 37/32715; H01J 2237/24571; H01J 2237/3343; H01L 21/67069; H01L 21/67253; H01L 21/6833

USPC .................................................... 156/345.24
See application file for complete search history.

(56) References Cited

U.S. PATENT DOCUMENTS

| | | | | |
|---|---|---|---|---|
| 2005/0061447 A1* | 3/2005 | Kim | ................... | H01J 37/32642 156/345.51 |
| 2017/0287682 A1* | 10/2017 | Musselman | ....... | H01J 37/32183 |
| 2017/0363407 A1* | 12/2017 | Sugita | ............... | H01L 21/67259 |
| 2020/0161101 A1* | 5/2020 | Ogata | ............... | H01J 37/32715 |
| 2020/0234929 A1* | 7/2020 | Ogata | ............... | H01J 37/32715 |
| 2020/0411390 A1* | 12/2020 | Yang | ................... | H01L 21/6831 |

FOREIGN PATENT DOCUMENTS

| | | |
|---|---|---|
| JP | 2002-176030 A | 6/2002 |
| JP | 2010-199526 A | 9/2010 |
| JP | 2016-146472 A | 8/2016 |

* cited by examiner

Primary Examiner — Charlee J. C. Bennett
(74) Attorney, Agent, or Firm — Weihrouch IP

(57) ABSTRACT

In a plasma processing apparatus, a mounting table have a first mounting surface on which a target object or a jig is mounted and a second mounting surface on which a ring member is mounted. The jig is used for measuring a thickness of the ring member disposed around the target object and having a facing portion facing an upper surface of the ring member. Elevating mechanisms lift or lower the ring member with respect to the second mounting surface. An acquisition unit acquires gap information indicating a gap dimension between the second mounting surface and the facing portion of the jig. A measurement unit measures a lifted distance of the ring member from the second mounting surface. A thickness calculation unit calculates the thickness of the ring member based on the gap dimension and the measured lifted distance of the ring member.

18 Claims, 9 Drawing Sheets

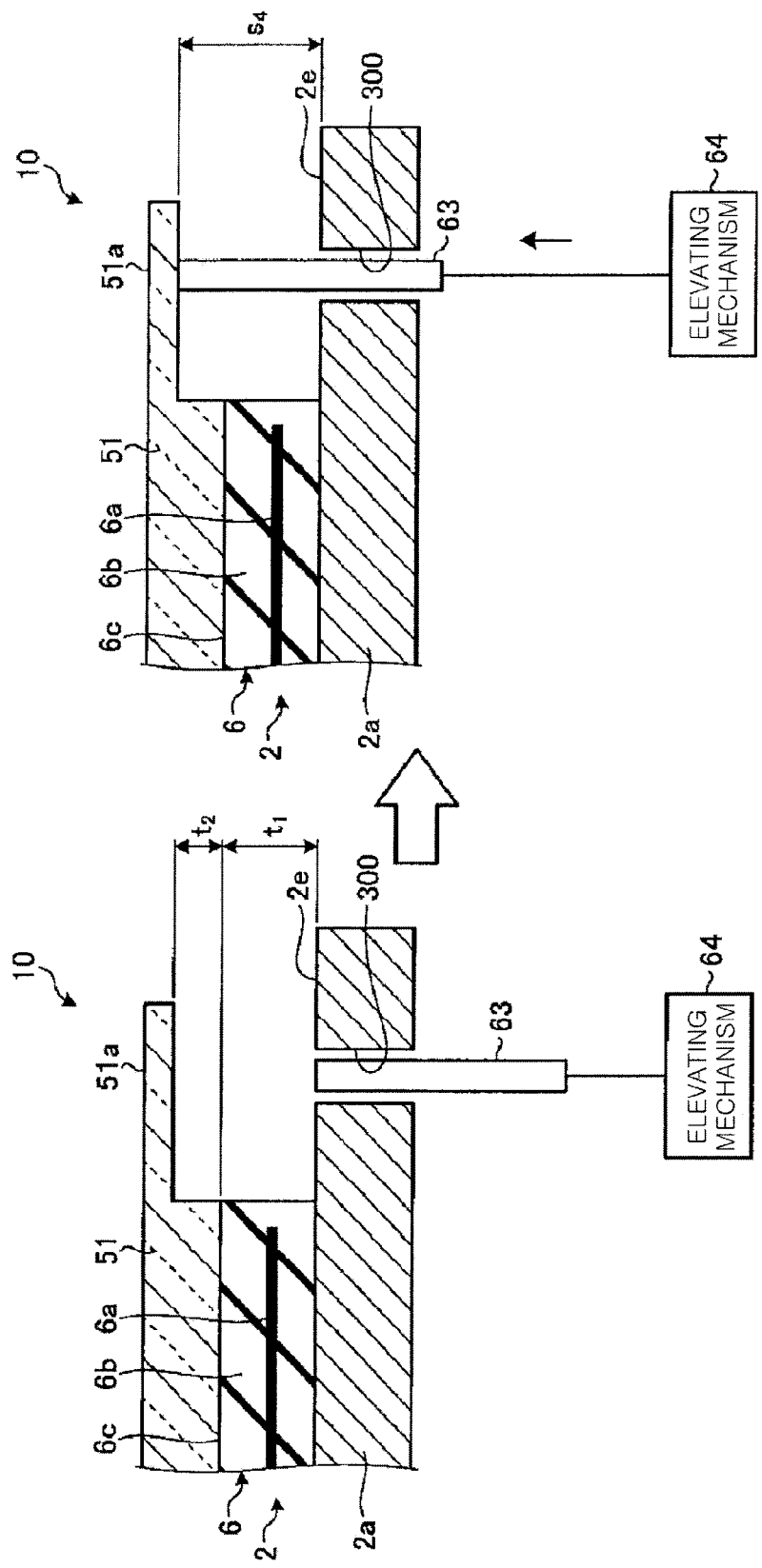

PLASMA PROCESSING APPARATUS AND METHOD FOR MEASURING THICKNESS OF RING MEMBER

CROSS-REFERENCE TO RELATED APPLICATIONS

This application claims priority to Japanese Patent Application No. 2018-188372, filed on Oct. 3, 2018, the entire contents of which are incorporated herein by reference.

TECHNICAL FIELD

The present disclosure relates to a plasma processing apparatus, and a method for measuring a thickness of a ring member.

BACKGROUND

Conventionally, there is known a plasma processing apparatus for performing plasma processing such as etching or the like on a target object such as a semiconductor wafer (hereinafter, also referred to as "wafer") or the like using plasma. In the plasma processing apparatus, parts in the chamber are consumed by the plasma processing. For example, a ring member such as a focus ring that is disposed to surround an outer peripheral portion of a wafer to make the plasma uniform is quickly consumed because it is close to the plasma. The degree of consumption of the focus ring greatly affects processing results on the wafer. For example, if a height of a plasma sheath above the focus ring and a height of a plasma sheath above the wafer are not the same, etching characteristics near the outer peripheral portion of the wafer deteriorate, thereby affecting the uniformity or the like.

Therefore, there is suggested a technique for lifting the focus ring using a driving mechanism in response to the consumption amount of the focus ring to maintain a height of the wafer and a height of the focus ring at a constant level (see, e.g., Japanese Patent Application Publication Nos. 2002-176030 and 2016-146472).

SUMMARY

In view of the above, the present disclosure provides a technique capable of accurately measuring a thickness of a ring member with a simple configuration.

In accordance with an aspect of the present disclosure, there is provided a plasma processing apparatus comprising: a mounting table having a first mounting surface on which a target object or a jig is mounted and a second mounting surface on which a ring member is mounted, the jig being used for measuring a thickness of the ring member disposed around the target object and having a facing portion facing an upper surface of the ring member; one or more elevating mechanisms configured to lift or lower the ring member with respect to the second mounting surface; an acquisition unit configured to acquire gap information indicating a gap dimension between the second mounting surface and the facing portion of the jig mounted on the first mounting surface; a measurement unit configured to measure a lifted distance of the ring member from the second mounting surface when the upper surface of the ring member is in contact with the facing portion of the jig mounted on the first mounting surface by lifting the ring member by using the elevating mechanisms; and a thickness calculation unit configured to calculate the thickness of the ring member based on the gap dimension and the measured lifted distance of the ring member.

BRIEF DESCRIPTION OF THE DRAWINGS

The objects and features of the present disclosure will become apparent from the following description of embodiments, given in conjunction with the accompanying drawings, in which:

FIGS. 9A and 9B explain exemplary flow of a process of measuring a gap dimension using a jig.

DETAILED DESCRIPTION

Figure 1:
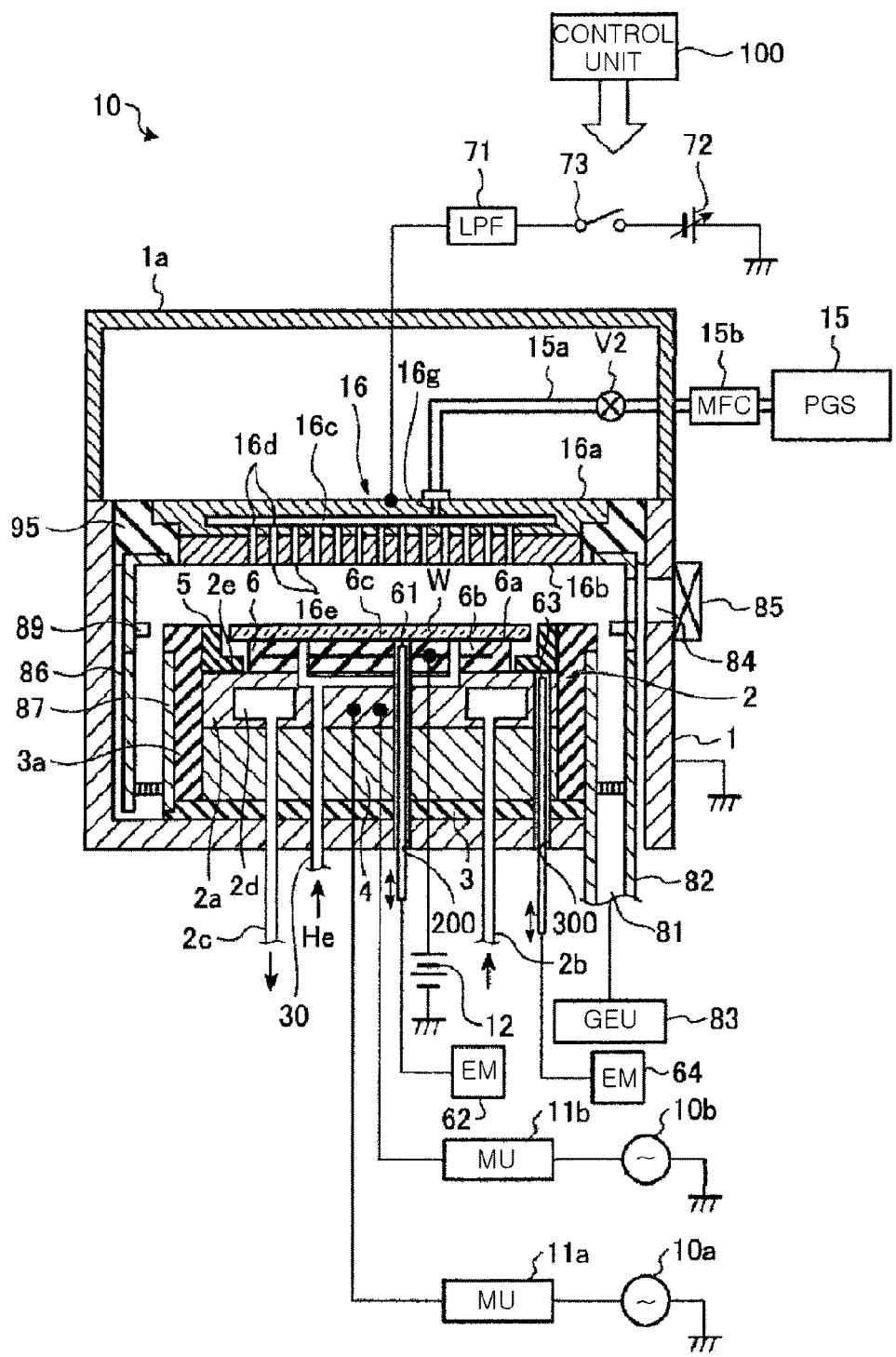
FIG. 1 is a schematic cross-sectional view showing a configuration of a plasma processing apparatus according to a first embodiment.

Hereinafter, embodiments will be described in detail with reference to the accompanying drawings. Like reference numerals will be given to like or corresponding parts throughout the drawings.

Conventionally, there is known a plasma processing apparatus for performing plasma processing such as etching or the like on a target object such as a semiconductor wafer (hereinafter, also referred to as "wafer") or the like using plasma. In the plasma processing apparatus, parts in the chamber are consumed by the plasma processing. For example, a ring member such as a focus ring that is disposed to surround an outer peripheral portion of a wafer to make the plasma uniform is quickly consumed because it is close to the plasma. The degree of consumption of the focus ring greatly affects processing results on the wafer. For example, if a height of a plasma sheath above the focus ring and a height of a plasma sheath above the wafer are not the same, etching characteristics near the outer peripheral portion of the wafer deteriorate, thereby affecting the uniformity or the like.

Therefore, there is suggested a technique for lifting the focus ring using a driving mechanism in response to the consumption amount of the focus ring to maintain a height of the wafer and a height of the focus ring at a constant level.

A consumption amount of a focus ring is specified by measuring a thickness of a consumed focus ring with respect to a thickness of a new focus ring. Therefore, it is expected to highly accurately measure the thickness of the focus ring with a simple configuration.

First Embodiment

<Configuration of Plasma Processing Apparatus>

FIG. 1 is a schematic cross-sectional view showing a configuration of a plasma processing apparatus 10 according to a first embodiment. The plasma processing apparatus 10 includes an airtight processing chamber 1 that is electrically grounded. The processing chamber 1 has a cylindrical shape and is made of, e.g., aluminum or the like. The processing chamber 1 defines a processing space where plasma is generated. A mounting table 2 for horizontally supporting a semiconductor wafer (hereinafter, simply referred to as "wafer") W that is a work-piece is disposed in the processing chamber 1. The mounting table 2 supports not only the wafer W but also a jig 51 (see FIG. 2) used for measuring a thickness of the focus ring 5 disposed to surround the wafer W. The structure of the jig 51 will be described later. The mounting table 2 includes a base 2a and an electrostatic chuck (ESC) 6.

The base 2a is made of a conductive metal, e.g., aluminum or the like, and serves as a lower electrode. The base 2a is supported by a support 4. The support 4 is supported by a support member 3 made of, e.g., quartz or the like. An annular focus ring 5 made of, e.g., single crystalline silicon, is disposed on an outer peripheral portion of the mounting table 2. An upper surface of an outer peripheral portion of the base 2a serves as a mounting surface 2e on which the focus ring 5 is mounted. A cylindrical inner wall member 3a made of, e.g., quartz or the like, is disposed in the processing chamber 1 to surround the peripheral portions of the mounting table 2 and the support 4.

A first RF power supply 10a is connected to the base 2a via a first matching unit (MU) 11a, and a second RF power supply 10b is connected to the base 2a via a second matching unit (MU) 11b. The first RF power supply 10a is configured to supply a high frequency power for plasma generation, which has a given frequency, to the base 2a of the mounting table 2. The second RF power supply 10b is configured to supply a high frequency power for ion attraction (for bias), which has a frequency lower than that of the first RF power supply 10a, to the base 2a of the mounting table 2. In this manner, a voltage can be applied to the mounting table 2. A shower head 16 serving as an upper electrode is disposed above the mounting table 2 to be opposite to the mounting table 2 in parallel therewith. The shower head 16 and the mounting table 2 function as a pair of electrodes (the upper electrode and the lower electrode).

The electrostatic chuck 6 is formed in a disk shape with a flat upper surface serving as a mounting surface 6c on which the jig 51 or the wafer W is mounted. The electrostatic chuck 6 is disposed at a central portion of the substrate 2a when viewed from the top. The electrostatic chuck 6 has a structure in which an electrode 6a is embedded in an insulator 6b. A DC power supply 12 is connected to the electrode 6a. When a DC voltage is applied from the DC power supply 12 to the electrode 6a, the jig 51 or the wafer W is attracted and held by a Coulomb force.

A coolant flow path 2d is formed inside the mounting table 2. A coolant inlet line 2b and a coolant outlet line 2c are connected to the coolant flow path 2d. The mounting table 2 can be controlled to a given temperature by circulating a proper coolant, e.g., cooling water or the like, through the coolant flow path 2d. A gas supply line 30 for supplying a cold heat transfer gas (backside gas) such as helium gas or the like to the backside of the wafer W is disposed to penetrate through the mounting table 2 and the like. The gas supply line 30 is connected to a gas supply source (not shown). With this configuration, the wafer W attracted and held by the electrostatic chuck 6 on the upper surface of the mounting table 2 can be controlled to a given temperature.

A plurality of, e.g., three (only one is shown in FIG. 1) pin through-holes 200 is disposed at a portion corresponding to the mounting surface 6c of the mounting table 2. Lifter pins 61 are respectively disposed inside the pin through-holes 200. The lifter pins 61 are connected to an elevating mechanism (EM) 62. The elevating mechanism 62 lifts or lowers the lifter pins 61 so that the lifter pins 61 protrude beyond or retract below the mounting surface 6c of the mounting table 2. In a state where the lifter pins 61 are lifted, the tip ends of the lifter pins 61 protrude beyond the mounting surface 6c of the mounting table 2, and the wafer W is held above the mounting surface 6c of the mounting table 2. On the other hand, in a state where the lifter pins 61 is lowered, the tip ends of the lifter pins 61 are accommodated in the pin through-holes 200, and the wafer W is mounted on the mounting surface 6c of the mounting table 2. In this manner, the elevating mechanism 62 lifts or lowers the wafer W with respect to the mounting surface 6c of the mounting table 2 using the lifter pins 61.

A plurality of, e.g., three (only one is shown in FIG. 1) pin through-holes 300 is disposed at a portion corresponding to the mounting surface 2e of the mounting table 2. Lifter pins 63 are respectively disposed inside the pin through-holes 300. The lifter pins 63 are connected to an elevating mechanism (EM) 64. The elevating mechanism 64 lifts or lowers the lifter pins 63 so that the lifter pins 63 protrude beyond or retract below the mounting surface 2e of the mounting table 2. In a state where the lifter pins 63 are lifted, the tip ends of the lifter pins 63 protrude beyond the mounting surface 2e of the mounting table 2, and the wafer W is held above the mounting surface 2e of the mounting table 2. On the other hand, in a state where the lifter pins 63 is lowered, the tip ends of the lifter pins 63 are accommodated in the pin through-holes 300, and the wafer W is mounted on the mounting surface 2e of the mounting table 2. In this manner, the elevating mechanism 64 lifts or lowers the wafer W with respect to the mounting surface 2e of the mounting table 2 using the lifter pins 63.

The shower head 16 is disposed at a ceiling wall portion of the processing chamber 1. The shower head 16 includes a main body 16a and an upper ceiling plate 16b serving as an electrode plate. The shower head 16 is supported at an upper portion of the processing chamber 1 through an insulating member 95. The main body 16a is made of a conductive material, e.g., aluminum having an anodically oxidized surface. The main body 16a has a structure to detachably attach the upper ceiling plate 16b at a bottom portion of the main body 16a.

A gas diffusion space 16c is formed in the main body 16a. A plurality of gas holes 16d is formed in a bottom portion of the gas diffusion space 16c to be positioned under the gas diffusion space 16c. Gas inlet holes 16e are formed through the upper ceiling plate 16b in a thickness direction thereof. The gas inlet holes 16e communicate with the gas holes 16d, respectively. With this configuration, a processing gas supplied to the gas diffusion space 16c is distributed in a shower-like manner into the processing chamber 1 through the gas holes 16d and the gas inlet holes 16e.

A gas inlet port 16g for introducing the processing gas into the gas diffusion space 16c is formed in the main body 16a. One end of a gas supply line 15a is connected to the gas inlet port 16g and the other end of the gas supply line 15a is connected to a processing gas supply source (gas supply unit) (PGS) 15 for supplying a processing gas. A mass flor controller (MFC) 15b and an opening/closing valve V2 are disposed in the gas supply line 15a in that order from an upstream side. The processing gas for plasma etching is supplied from the processing gas supply source 15 to the gas diffusion space 16c through the gas supply line 15a. The processing gas is distributed in a shower-like manner into the processing chamber 1 from the gas diffusion chamber 16c through the gas holes 16d and the gas inlet holes 16e.

A variable DC power supply 72 is electrically connected to the shower head 16 serving as the upper electrode through a low pass filter (LPF) 71. The power supply of the variable DC power supply 72 can be on-off controlled by an on/off switch 73. A current and a voltage of the variable DC power supply 72 and on/off operation of the on/off switch 73 are controlled by a control unit 100 to be described later. As will be described later, when plasma is generated in a processing space by applying the high frequency power from the first RF power supply 10a and the second RF power supply 1b to the mounting table 2, the on/off switch 73 is turned on by the control unit 100 and a given DC voltage is applied to the shower head 16 serving as the upper electrode, if necessary.

A cylindrical grounding conductor 1a extends upward from a sidewall of the processing chamber 1 to be located at a position higher than the shower head 16. The cylindrical ground conductor 1a has a ceiling wall at the top thereof.

A gas exhaust port 81 is formed at a bottom of the processing chamber 1. A first gas exhaust unit (GEU) 83 is connected to the gas exhaust port 81 through a gas exhaust line 82. The first gas exhaust unit 83 has a vacuum pump. By operating the vacuum pump, a pressure in the processing chamber 1 can be decreased to a given vacuum level. A loading/unloading port 84 for the wafer W is disposed at the sidewall of the processing chamber 1. A gate valve 85 for opening or closing the loading/unloading port 84 is disposed at the loading/unloading port 84.

A deposition shield member 86 is disposed along an inner surface of the sidewall of the processing chamber 1. The deposition shield member 86 prevents etching by-product (deposits) from being attached to the processing chamber 1. A conductive member (GND block) 89 is disposed at a portion of the deposition shield member 86 at substantially the same height as the height of the wafer W. The conductive member 89 is connected to the ground such that a potential for the ground can be controlled. Due to the presence of the conductive member 89, abnormal discharge can be prevented. A deposition shield member 87 extending along the inner wall member 3a is disposed at a lower end portion of the deposition shield member 86. The deposition shield members 86 and 87 are detachably provided.

The operation of the plasma processing apparatus 10 configured as described above is integrally controlled by the control unit 100. The control unit 100 is, e.g., a computer, and controls the respective components of the plasma processing apparatus 10.

<Configuration of Mounting Table>

Figure 2:
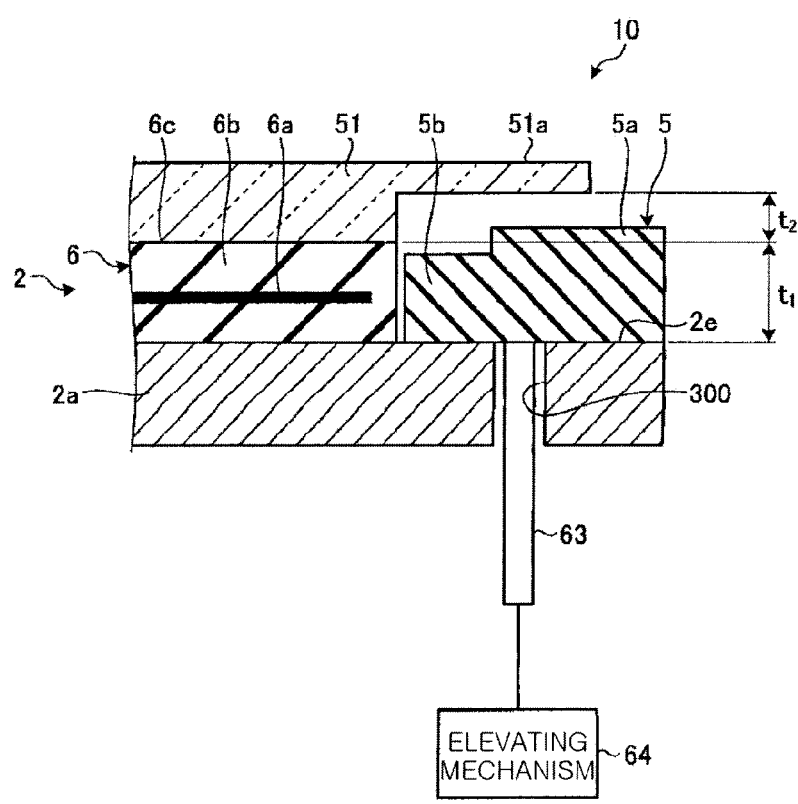
FIG. 2 is a schematic cross-sectional view showing a main configuration of a mounting table according to the first embodiment.

Next, the main configuration of the mounting table 2 according to the first embodiment will be described with reference to FIG. 2. FIG. 2 is a schematic cross-sectional view showing the main configuration of the mounting table 2 according to the first embodiment.

As shown in FIG. 2, the mounting table 2 includes the base 2a and the electrostatic chuck 6. The electrostatic chuck 6 has a disk shape and is disposed at the central portion of the base 2a to be coaxial with the base 2a. The electrostatic chuck 6 has a configuration in which the electrode 6a is embedded in the insulator 6b. The upper surface of the electrostatic chuck 6 serves as the mounting surface 6c on which the jig 51 or the wafer W is mounted. FIG. 2 shows a state where the jig 51 is mounted on the mounting surface 6c. The upper surface of the outer peripheral portion of the base 2a serves as the mounting surface 2e on which the focus ring 5 is mounted. The mounting surface 6c is an example of a first mounting surface, and the mounting surface 2e is an example of a second mounting surface.

The focus ring 5 is an annular member. The focus ring 5 is disposed to surround an outer peripheral portion of the base 2a to be coaxial with the base 2a. The focus ring 5 includes a body portion 5a and a protruding portion 5b projecting inward in a radial direction from an inner side surface of the body portion 5a. The upper surface of the protruding portion 5b is lower than the upper surface of the body portion 5a. In other words, the upper surface of the focus ring 5 has different heights depending on positions in the radial direction. For example, the height of the upper surface of the body portion 5a is higher than the height of the mounting surface 6c. The height of the upper surface of the protrusion 5b is lower than the height of the mounting surface 6c. The focus ring 5 is an example of a ring member.

The jig 51 is used for measuring a thickness of the focus ring 5. The jig 51 has a facing portion 51a facing the upper surface of the focus ring 5. In the first embodiment, the facing portion 51a of the jig 51 is positioned above the body portion 5a and the protruding portion 5b of the focus ring 5 in a state where the jig 51 is mounted on the mounting surface 6c. In other words, when viewed in a direction orthogonal to the mounting surface 6c, the facing portion 51a is disposed at a position overlapping with the body portion 5a and the protruding portion 5b and covers the body portion 5a and the protruding portion 5b. Accordingly, when the elevating mechanism 64 lifts the focus ring 5 with respect to the mounting surface 2e of the mounting table 2 using the lifter pins 63, the upper surface of the body portion 5a is brought into contact with the facing portion 51a of the jig 51.

Since the jig 51 is attracted and held on the electrostatic chuck 6 by the Coulomb force, the jig 51 is made of a conductive material. Alternatively, the jig 51 may have a conductor layer on a surface to be in contact with the mounting surface 6c of the electrostatic chuck 6. The strength of the jig 51 is set such that the facing portion 51a is not deformed when the upper surface of the body portion 5a is in contact with the facing portion 51a of the jig 51.

The pin through-holes 300 for accommodating the lifter pins 63 are formed in the mounting surface 2e. The lifter pins 63 are connected to the elevating mechanism 64. The elevating mechanism 64 incorporates a driving motor, and extends or contracts an extensible and contractible rod by a driving force of the driving motor so that the lifter pins 63 can protrude beyond or retract below the mounting surface 2e. The elevating mechanism 64 adjusts the height of the stop position of the lifter pins 63 such that the tip ends of the lifter pins 63 are in contact with the bottom surface of the focus ring 5 when the lifter pins 63 are accommodated. The elevating mechanism 64 is provided with a torque sensor for detecting a driving torque generated at the driving motor at the time of raising the lifter pins 63. Data of the driving torque detected by the torque sensor is outputted to the control unit 100 to be described later. The elevating mechanism 64 is provided with a position detector, e.g., an encoder or the like, for detecting the positions of the tip ends of the lifter pins 63. The data of the positions of the tip ends of the lifter pins 63 detected by the position detector is outputted to the control unit 100 to be described later.

In the above description, the case in which the tip ends of the lifter pins 63 are in contact with the bottom surface of the focus ring 5 when the lifter pins 63 are accommodated has been described as an example. However, the present invention is not limited thereto. For example, the ends of the lifer pins 63 may not in contact with the bottom surface of the focus ring 5 and there is a gap between the ends of the lifer pins 63 and the bottom surface of the focus ring 5 when the lifter pins 63 are accommodated. In this case, the position detector, e.g., an encoder or the like, for detecting the positions of the tip ends of the lifter pins 63 adjusts the position where the tip ends of the lifter pins 63 are in contact with the bottom surface of the focus ring 5 as a reference point.

The pin through-holes 300, the lifter pins 63, and the elevating mechanism 64 are arranged at multiple locations in a circumferential direction of the focus ring 5. In the plasma processing apparatus 10 according to the first embodiment, three sets of the pin through-holes 300, the lifter pins 63, and the elevating mechanism 64 are disposed. For example, the sets of the pin through-holes 300, the lifter pins 63, and the elevating mechanisms 64 are arranged on the mounting table 2 at an equal interval in the circumferential direction of the mounting table 2. The torque sensors of the elevating mechanisms 64 detect the driving torque of the driving motors at the positions of the elevating mechanisms 64 and output the detection results to the control unit 100. The position detectors of the elevating mechanisms 64 detect the positions of the tip ends of the lifter pins 63 corresponding thereto at the locations where the elevating mechanisms 64 are disposed, and output the detection results to the control unit 100.

<Configuration of Control Unit>

Figure 3:
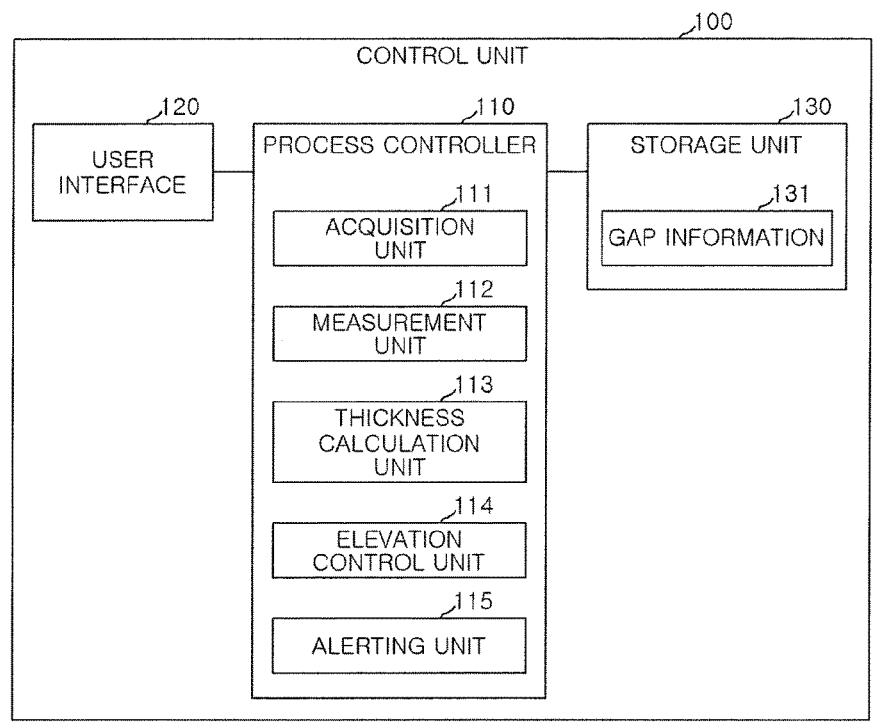
FIG. 3 is a block diagram showing a schematic configuration of a control unit for controlling the plasma processing apparatus according to the first embodiment.

Next, the control unit 100 will be described in detail. FIG. 3 is a block diagram showing a schematic configuration of the control unit 100 for controlling the plasma processing apparatus 10 according to the first embodiment. The control unit 100 includes a process controller 110, a user interface 120, and a storage unit 130.

The process controller 110 includes a CPU (Central Processing Unit) and controls the respective components of the plasma processing apparatus 10.

The user interface 120 includes a keyboard through which a process manager inputs commands to operate the plasma processing apparatus 10, a display for visualizing an operation status of the plasma processing apparatus 10, and the like.

The storage unit 130 stores therein recipes including a control program (software), processing condition data and the like for realizing various processes performed by the plasma processing apparatus 100 under the control of the process controller 1101. For example, the storage unit 130 stores gap information 131. The recipes including the control program, the processing condition data and the like can be stored in a computer-readable storage medium (e.g., a hard disk, an optical disk such as DVD or the like, a flexible disk, a semiconductor memory, or the like) or can be transmitted, when needed, from another apparatus through, e.g., a dedicated line, and used online.

The gap information 131 is data in which "gap dimension" between the mounting surface 2e and the facing portion 51a of the jig 51 mounted on the mounting surface 6c is stored. The gap dimension is predetermined based on the distance between the mounting surface 2e and the mounting surface 6c and the distance between the mounting surface 6c and the facing portion 51a of the jig 51 mounted on the mounting surface 6c. For example, when the jig 51 shown in FIG. 2 is mounted on the mounting surface 6c, the distance between the mounting surface 2e and the mounting surface 6c is "$t_1$", and the distance between the mounting surface 6c and the facing portion 51a of the jig 51 mounted on the mounting surface 6c is "$t_2$". Therefore, "$t_1+t_2$", i.e., the sum of the distance between the mounting surface 2e and the mounting surface 6c and the distance between the mounting surface 6c and the facing portion 51a of the jig 51 mounted on the mounting surface 6c, is determined as the gap dimension. In this case, the gap dimension "$t_1+t_2$" is stored as the gap information 131 in the storage unit 130.

Referring back to FIG. 3, the process controller 110 has an internal memory for storing programs or data, and reads out a control program stored in the storage unit 130 and executes the read-out control program. The process controller 110 serves as various processing units by operating the control program. For example, the process controller 110 includes an acquisition unit 111, a measurement unit 112, a thickness calculation unit 113, an elevation control unit 114, and an alerting unit 115.

In the plasma processing apparatus 10, when the plasma processing is performed, the focus ring 5 is consumed and the thickness of the focus ring 5 is reduced. When the thickness of the focus ring 5 is reduced, the height of the plasma sheath above the focus ring 5 is not the same as that of the plasma sheath above the wafer W, and etching characteristics are changed.

For example, when the height of the plasma sheath above the focus ring 5 is lower than the height of the plasma sheath above the wafer W, the plasma sheath is inclined near the peripheral portion of the wafer W, and positive ions are incident on the peripheral portion of the wafer W at an inclined angle. The changes in the incident angle of the positive ions lead to changes in the etching characteristics. For example, shape abnormality in which a hole formed by etching extends obliquely with respect to a vertical direction of the wafer W occurs. Such a shape abnormality is referred to as "tilting".

The consumption amount of the focus ring 5 is specified by measuring a thickness of a consumed focus ring 5 with respect to a thickness of a new focus ring 5. As for a method for measuring the thickness of the focus ring 5, there is suggested a method using reflection of laser beam (see, e.g., Japanese Patent Application Publication No. 2010-199526). However, the method using reflection of the laser light is disadvantageous in that a device configuration may become complicated because an optical path of the laser beam is formed the mounting table 2 or in that the optical path of the laser beam may become a singularity in plasma distribution. Therefore, there is a demand for a plasma processing apparatus 10 capable of simply and accurately measuring the thickness of the focus ring 5 without using laser beam.

Accordingly, in the plasma processing apparatus 10, the thickness of the focus ring 5 is measured using the jig 51 mounted on the mounting surface 6c.

Referring back to FIG. 2, the acquisition unit 111 acquires the gap information 131 indicating the gap dimension between the mounting surface 2e and the facing portion 51a of the jig 51 mounted on the mounting surface 6c. For example, the acquisition unit 111 reads out and acquires the gap information 131 indicating the gap dimension between the mounting surface 2e and the facing portion 51a of the jig 51 mounted on the mounting surface 6c from the storage unit 130. In the present embodiment, the gap information 131 is stored in advance in the storage unit 130. However, when the gap information 131 is stored in another device, the acquisition unit 111 may acquire the gap information 131 from another device via a network.

The measurement unit 112 lifts the lifter pins 63 using the elevating mechanism 64 in a state where the jig 51 is mounted on the mounting surface 6c to lift the focus ring 5 until the upper surface of the focus ring 5 (i.e., the upper surface of the body portion 5a) becomes in contact with the facing portion 51a of the jig 51. Then, the measurement unit 112 measures a lifted distance of the focus ring 5 from the mounting surface 2e when the upper surface of the focus ring 5 (i.e., the upper surface of the body portion 5a) is in contact with the facing portion 51a of the jig 51. For example, the measurement unit 112 lifts the focus ring 5 using the elevating mechanisms 64 arranged at multiple locations in the circumferential direction of the focus ring 5. Then, the measuring unit 112 measures the lifted distance of the focus ring 5 from the mounting surface 2e at the multiple locations in the circumferential direction of the focus ring 5 when the upper surface of the focus ring 5 is in contact with the facing portion 51a of the jig 51. Whether or not the upper surface of the focus ring 5 is in contact with the facing portion 51a of the jig 51 is determined by comparing a given threshold value and values of the driving torques detected by the torque sensors of the elevating mechanisms 64 at the locations where the elevating mechanisms 64 are disposed. The lifted distance of the focus ring 5 from the mounting surface 2e is measured using the positions of the tip ends of the lifter pins 63 detected by the position detectors of the elevating mechanisms 64 at the locations where the elevating mechanisms 64 are disposed.

The thickness calculation unit 113 calculates the thickness of the focus ring 5 (i.e., the thickness of the body portion 5a) based on the gap dimension indicated by the gap information 131 acquired by the acquisition unit 111 and the lifted distance of the focus ring 5 measured by the measurement unit 112. For example, when the gap dimension indicated by the gap information 131 is "$t_1+t_2$" obtained in the case of the jig 51 shown in FIG. 2, the thickness calculation unit 113 calculates the thickness of the focus ring 5 (i.e., the thickness of the body portion 5a) by subtracting the measured lifted distance of the focus ring 5 from the gap dimension "$t_1+t_2$". Further, the thickness calculation unit 113 calculates the thickness of the focus ring 5 (i.e., the thickness of the body portion 5a) at the multiple locations in the circumferential direction of the focus ring 5.

Accordingly, in the plasma processing apparatus 10, it is possible to highly accurately measure the thickness of the focus ring 5 with a simple configuration in which the focus ring 5 is lifted until the upper surface of the focus ring 5 becomes in contact with the facing portion 51a of the jig 51 mounted on the mounting surface 6c.

The elevation control unit 114 individually controls the elevating mechanisms 64 such that the upper surface of the focus ring 5 is maintained at a given height based on the thickness of the focus ring 5 calculated by the thickness calculation unit 113. For example, the elevation control unit 114 lifts or lowers the focus ring 15 by individually lifting or lowering the lift pins 63 at the locations where the elevating mechanisms 64 are disposed. For example, the elevation control unit 114 specifies the consumption amount of the focus ring 5 by subtracting the calculated thickness of the focus ring 5 from a thickness of a new focus ring 5 and lifts the lift pins 63 by the consumption amount of the focus ring 5 by controlling the elevating mechanisms 64. The thickness of the new focus ring 5 may be pre-measured by the measurement unit 112 and the thickness calculation unit 113.

The consumption amount of the focus ring 5 may be not uniform in the circumferential direction of the mounting table 2. In the plasma processing apparatus 10, the consumption amount of the focus ring 5 is specified at multiple locations in the circumferential direction of the focus ring 5 where the lifter pins 63 and the elevating mechanisms 64 are arranged, and the elevating mechanisms 64 are controlled to lift the lifter pins 63 in response to the consumption amount. Accordingly, in the plasma processing apparatus 10, the upper surface of the focus ring 5 can be aligned with the upper surface of the wafer W in the circumferential direction of the mounting table 2. As a result, it is possible to maintain the uniformity of the etching characteristics along the circumferential direction of the mounting table 2.

The alerting unit 115 performs alerting based on the thickness of the focus ring 5 calculated by the thickness calculation unit 113. For example, the alerting is performed when the thickness of the focus ring 5 calculated by the thickness calculation unit 113 is smaller than or equal to a given allowable value. The alerting may be performed in any manner as long as a process manager or a manager of the plasma processing apparatus 10 can be notified of abnormality. For example, the alerting unit 115 displays a message informing the user interface 120 of the abnormality. Accordingly, the plasma processing apparatus 10 can notify the abnormality when the thickness of the focus ring 5 is reduced and the replacement of the focus ring 5 is required.

<Control Flow>

Figure 4:
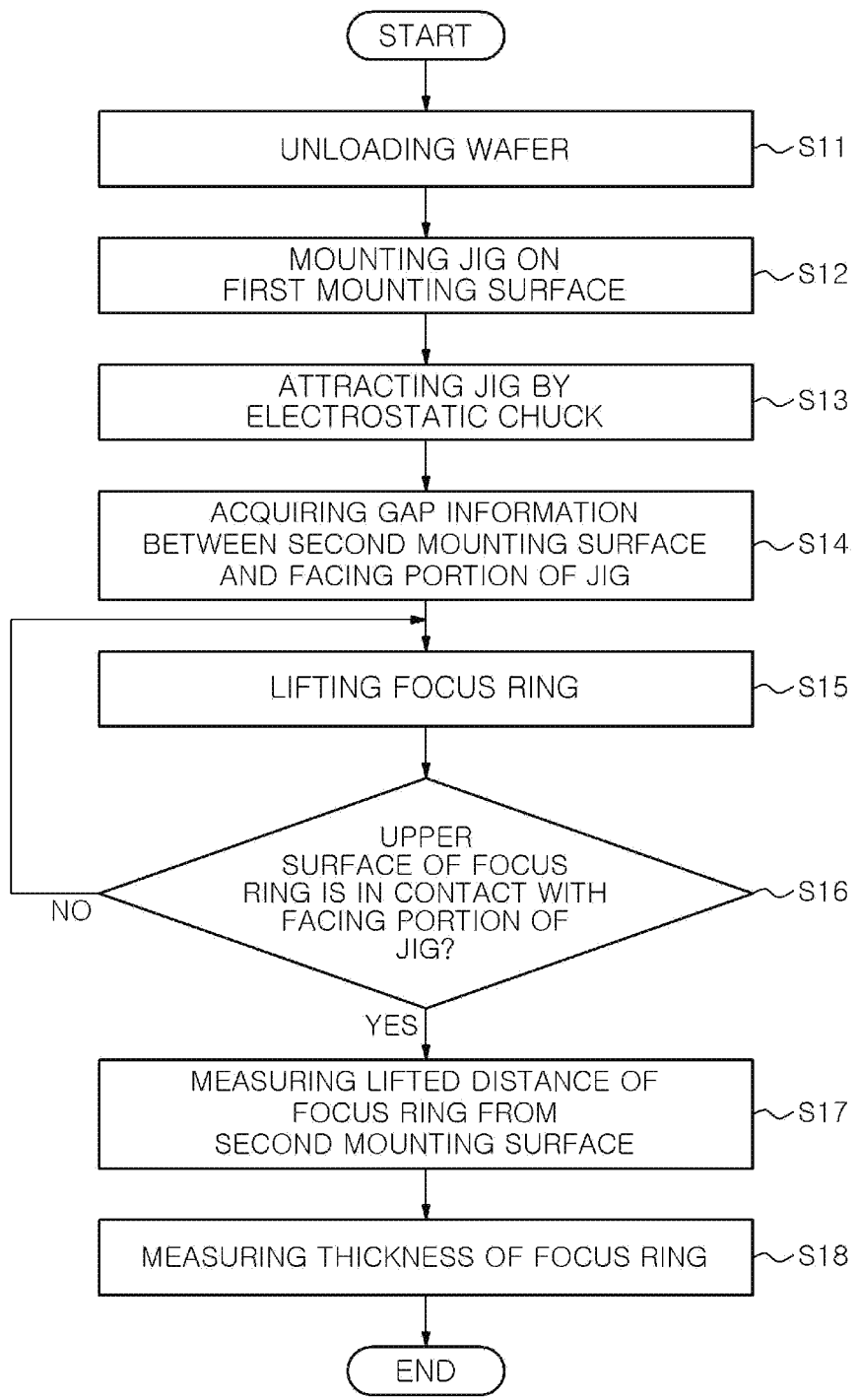
FIG. 4 is a flowchart showing exemplary flow of a focus ring thickness measurement process.

Next, a process of measuring a thickness of the focus ring 5 using the plasma processing apparatus 10 according to the first embodiment will be described. FIG. 4 is a flowchart showing exemplary flow of the process of measuring a thickness of the focus ring 5. The thickness of the focus ring 5 is measured, e.g., after the plasma processing on the wafer W is completed.

As shown in FIG. 4, the wafer W is unloaded from the processing chamber 1 by a transfer arm (step S11). The jig 51 is loaded into the processing chamber 1 and mounted on the mounting surface 6c (first mounting surface) by the transfer arm (step S12). Then, the jig 51 is attracted and held by the electrostatic chuck 6 (step S13). At this time, the electrostatic attractive force of the electrostatic chuck 6 is set to prevent the jig 51 from being separated from the mounting surface 6c when the facing portion 51a of the jig 51 and the upper surface of the focus ring 5 are brought into contact with each other.

The acquisition unit 111 acquires the gap information 131 indicating the gap dimension between the mounting surface 2e (second mounting surface) and the facing portion 51a of the jig 51 mounted on the mounting surface 6c (step S14).

The measurement unit 112 lifts the focus ring 5 by lifting the lift pins 63 using the elevating mechanisms 64 in a state where the jig 51 is mounted on the mounting surface 6c and attracted and held by the electrostatic chuck 6 (step S15).

The measurement unit 112 determines whether or not the upper surface of the focus ring 5 is in contact with the facing portion 51a of the jig 51 (step S16).

When the upper surface of the focus ring 5 is not in contact with the facing portion 51a of the jig 51 (No in step S16), the measurement unit 112 continues to lift the focus ring 5 (step S15).

On the other hand, when the upper surface of the focus ring 5 is in contact with the facing portion 51a of the jig 51 (Yes in step S16), the measurement unit 112 measures the lifted distance of the focus ring 5 from the mounting surface 2e (step S17).

The thickness calculation unit 113 calculates the thickness of the focus ring 5 based on the gap dimension indicated by the gap information 131 acquired by the acquisition unit 111 and the lifted distance of the focus ring 5 measured by the measurement unit 112 (step S18). Then, the processing is terminated.

Figure 5:
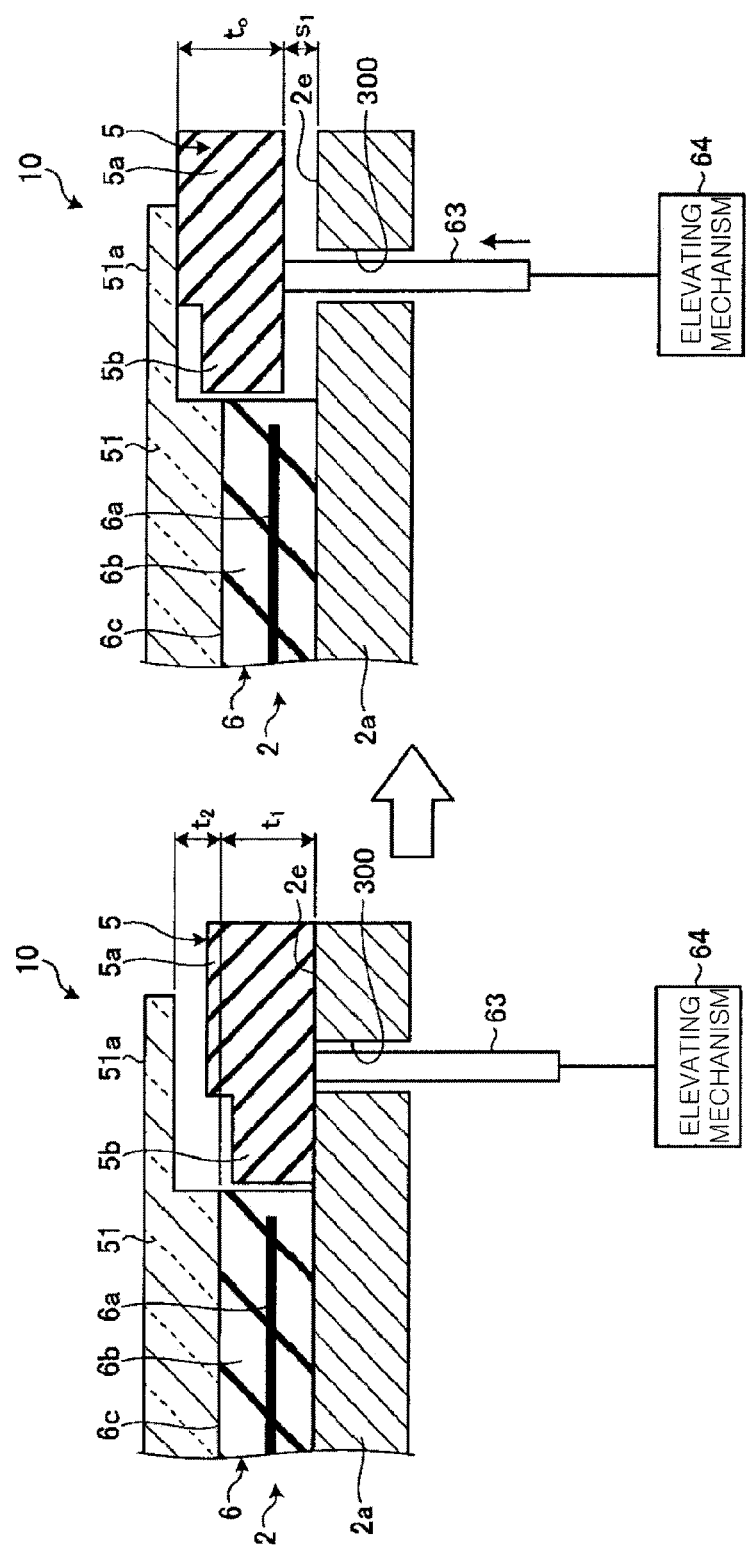
FIGS. 5A and 5B explain the exemplary flow of the focus ring thickness measurement process.

Next, a specific example will be described. FIGS. 5A and 5B explain the exemplary flow of the process of measuring the thickness of the focus ring 5. FIG. 5A shows a state where the jig 51 is mounted on the mounting surface 6c. The jig 51 has the facing portion 51a facing the upper surface of the focus ring 5. The facing portion 51a of the jig 51 is positioned above the body portion 5a and the protruding portion 5b of the focus ring 5 in a state where the jig 51 is mounted on the mounting surface 6c. The distance between the mounting surface 2e and the mounting surface 6c is "$t_1$", and the distance between the mounting surface 6c and the facing portion 51a of the jig 51 mounted on the mounting surface 6c is "$t_2$." Therefore, "$t_1+t_2$" is the gap dimension between the mounting part 2e and the facing portion 51a of the jig 51 mounted in the mounting surface 6c. In the plasma processing apparatus 10, the measurement unit 112 lifts the focus ring 5 by lifting the lifter pins 63 using the elevating mechanisms 64 until the upper surface of the focus ring 5 (i.e., the upper surface of the body portion 5a) becomes in contact with the facing portion 51a of the jig 51. FIG. 5B shows a state where the upper surface of the body portion 5a is in contact with the facing portion 51a of the jig 51. In the example of FIG. 5B, the focus ring 5 is lifted from the mounting surface 2e by "$s_1$". As shown in FIG. 5B, the measurement unit 112 calculates the lifted distance "$s_1$" of the focus ring 5 from the mounting surface 2e when the upper surface of the body portion 5a is in contact with the facing part 51a of the jig 51. Then, in the plasma processing apparatus 10, the thickness calculation unit 113 calculates the thickness "$t_o$" of the body portion 5a by subtracting the measured lifted distance "$s_1$" of the focus ring 5 from the gap dimension "$t_1+t_2$". Accordingly, the plasma processing apparatus 10 can highly accurately measure the thickness of the body portion 5a with a simple configuration in which the focus ring 5 is lifted until the upper surface of the body portion 5a becomes in contact with the facing portion 51a of the jig 51 mounted on the mounting surface 6c.

Figure 6:
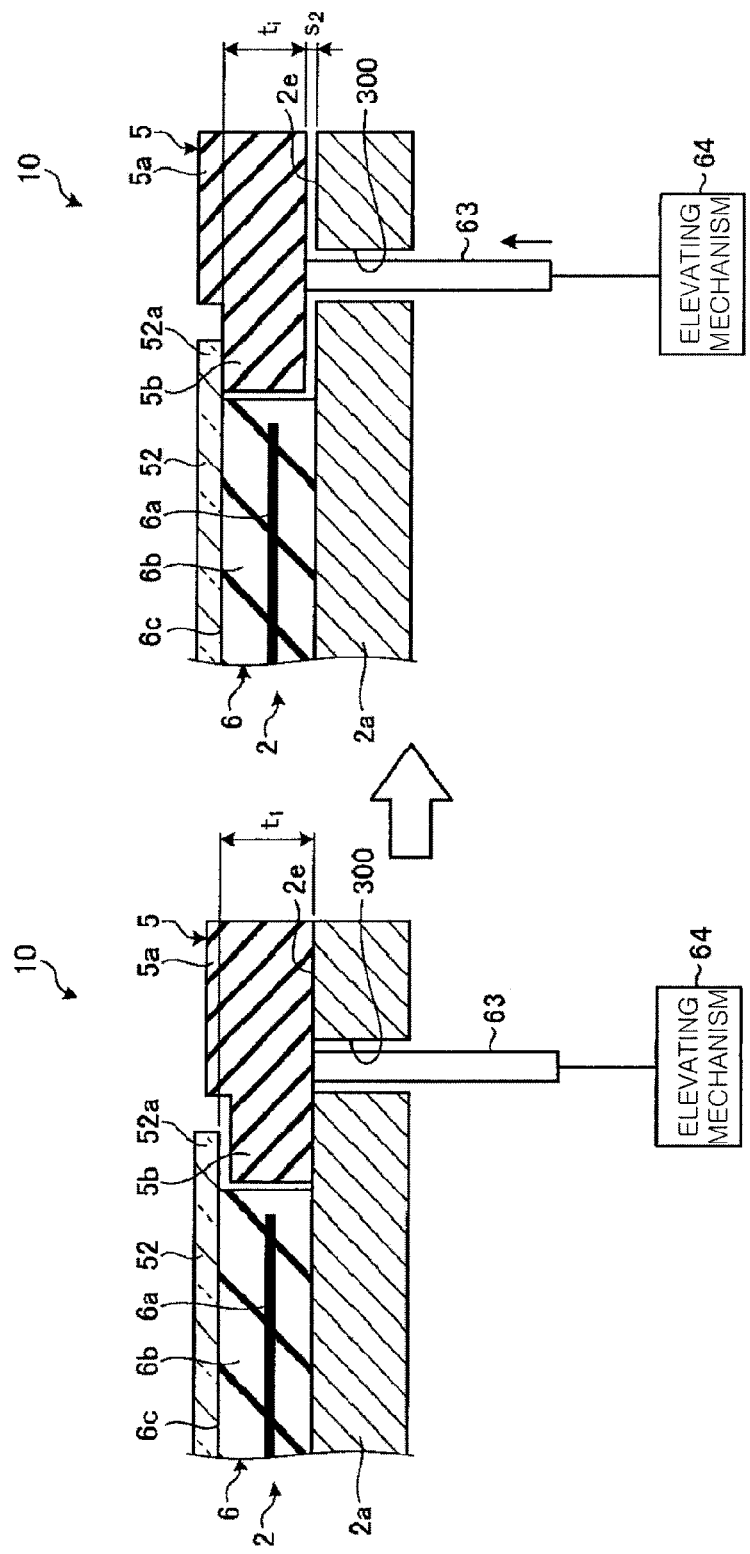
FIGS. 6A and 6B explain another exemplary flow of the focus ring thickness measurement process.

The plasma processing apparatus 10 may measure the thickness of a portion of the focus ring 5 other than the body portion 5a using another jig having a shape different from that of the jig 51. FIGS. 6A and 6B explain another exemplary flow of the process of measuring the thickness of the focus ring 5. FIG. 6A shows a state where a jig 52 having a shape different from that of the jig 51 is mounted on the mounting surface 6c. The jig 52 has a facing portion 52a facing the upper surface of the focus ring 5. The facing portion 52a of the jig 52 is positioned above the protruding portion 5b of the focus ring 5 in a state where the jig 52 is mounted on the mounting surface 6c. The mounting surface 6c and the facing portion 52a of the jig 52 mounted on the mounting surface 6c are located on the same plane. The distance between the mounting surface 2e and the mounting surface 6c is "$t_1$". Since the mounting surface 6c and the facing portion 52a of the jig 52 mounted on the mounting surface 6c are located on the same plane, the distance between the mounting surface 6c and the jig 52 mounted on the mounting surface 6c is "0". Therefore, the gap dimension between the mounting surface 2e and the facing portion 52a of the jig 52 mounted in the mounting surface 2e is "$t_1$". In the plasma processing apparatus 10, the measurement unit 112 lifts the focus ring 5 until the upper surface of the focus ring 5 (i.e., the upper surface of the protruding portion 5b) becomes in contact with the facing portion 52a of the jig 52 by lifting the lifter pins 63 using the elevating mechanisms 64. FIG. 6B shows a state where the upper surface of the protruding portion 5b is in contact with the facing portion 52a of the jig 52. In the example of FIG. 6B, the focus ring 5 is lifted from the mounting surface 2e by "$s_2$". As shown in FIG. 6B, the measurement unit 112 calculates the lifted distance "$s_2$" of the focus ring 5 from the mounting surface 2e when the upper surface of the protruding portion 5b is in contact with the facing portion 52a of the jig 52. Then, in the plasma processing apparatus 10, the thickness calculation unit 113 calculates a thickness "$t_t$" of the protruding portion 5b by subtracting the measured lifted distance "$s_2$" of the focus ring 5 from the gap dimension "$t_1$". Accordingly, the plasma processing apparatus 10 can highly accurately measure the thickness of the protruding portion 5b with a simple configuration in which the focus ring 5 is lifted until the upper surface of the protruding portion 5b becomes in contact with the facing portion 52a of the jig 52 mounted on the mounting surface 6c.

Figure 7:
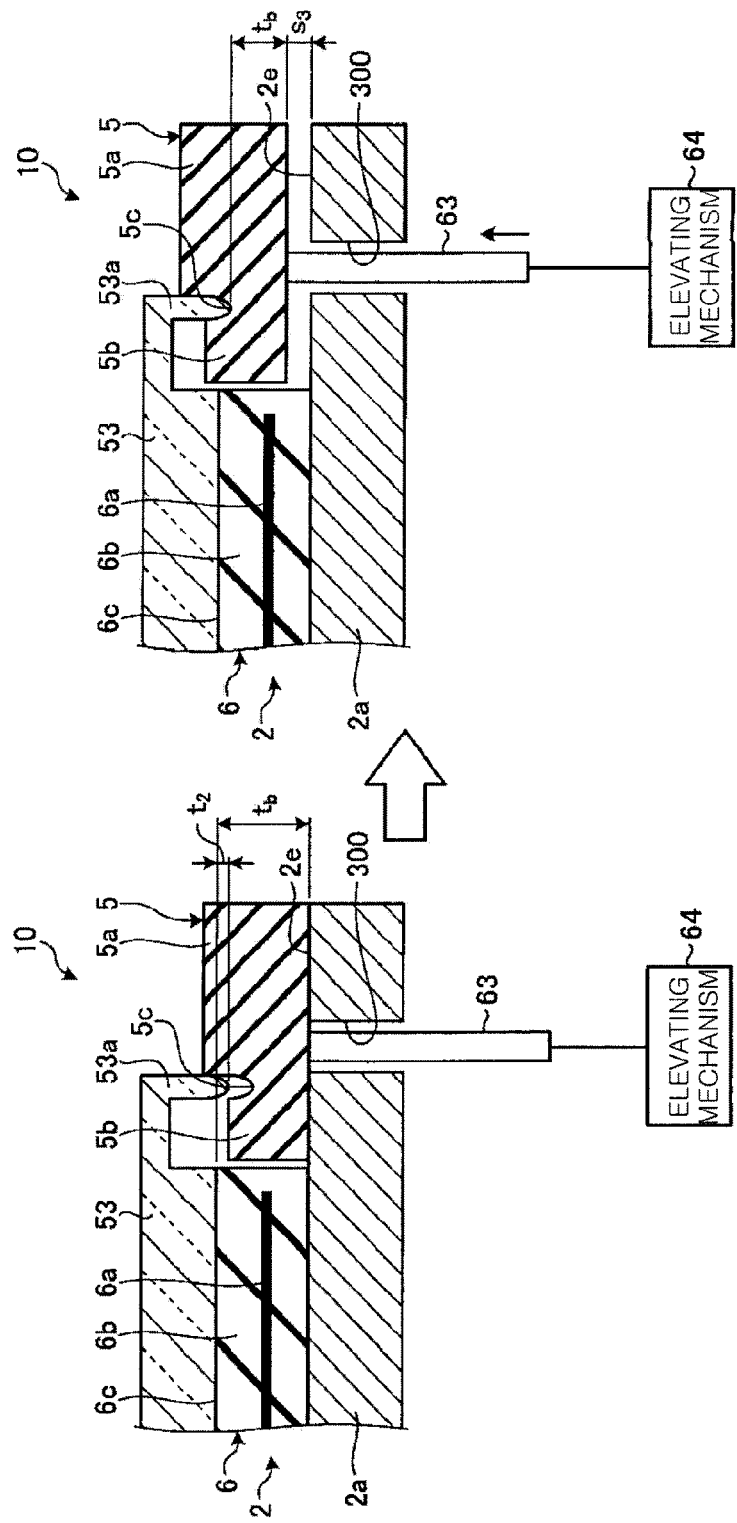
FIGS. 7A and 7B explain still another exemplary flow of the focus ring thickness measurement process.

FIGS. 7A and 7B explain still another exemplary flow of the process of measuring the thickness of the focus ring 5. FIG. 7A shows a state where a jig 53 having a shape different from that of the jig 51 is mounted on the mounting surface 6c. The jig 53 has a facing portion 53a facing the upper surface of the focus ring 5. The facing portion 53a of the jig 53 is curved toward a boundary portion 5c between the body portion 5a and the protruding portion 5b in a state where the jig 53 is mounted on the mounting surface 6c. The boundary portion 5c between the body portion 5a and the protruding portion 5b is easily damaged by plasma in the peripheral portion of the wafer W and is consumed more than other portions of the focus ring. In the example of FIG. 7A, a state where the boundary portion 5c is consumed is shown. The distance between the mounting surface 2e and the mounting surface 6c is "$t_1$", and the distance between the mounting surface 6c and the facing portion 53a of the jig 53 mounted on the mounting surface 6c is "$t_2$". Therefore, "$t_1-t_2$" is the gap dimension between the mounting surface 2e and the facing portion 51a of the jig 51 mounted on the mounting surface 6c. In the plasma processing apparatus 10, the measurement unit 112 lifts the focus ring 5 until the upper surface of the focus ring 5 (i.e., the upper surface of the boundary portion 5c) becomes in contact with the facing portion 53a of the jig 53 by lifting the lifter pins 63 using the elevating mechanisms 64. FIG. 7B shows a state where the upper surface of the boundary portion 5c is in contact with the facing portion 53a of the jig 53. In the example of FIG. 7B, the focus ring 5 is lifted from the mounting surface 2e by "$s_3$". As shown in FIG. 7B, the measurement unit 112 measures the lifted distance "$s_3$" of the focus ring 5 from the mounting surface 2e when the upper surface of the boundary portion 5c is in contact with the facing portion 53a of the jig 53. Then, in the plasma processing apparatus 10, the thickness calculation unit 113 calculates a thickness "$t_b$" of the boundary portion 5c by subtracting the measured lifted distance "$s_3$" of the focus ring 5 from the gap dimension "$t_1-t_2$". Accordingly, the plasma processing apparatus 10 can highly accurately measure the thickness of the boundary portion 5c with a simple configuration in which the focus ring 5 is lifted until the upper surface of the boundary portion 5c becomes in contact with the facing portion 53a of the jig 53 mounted on the mounting surface 6c.

As described above, the plasma processing apparatus 10 according to the first embodiment includes the mounting table 2, the elevating mechanisms 64, the acquisition unit 111, the measurement unit 112, and the thickness calculation unit 113. The mounting table 2 has the mounting surface 6c on which the wafer W or the jig 51 used for measuring a thickness of the focus ring 5 is mounted and the mounting surface 2e on which the focus ring 5 is mounted, the jig 51 having the facing portion 51a facing the upper surface of the focus ring 5. The elevating mechanisms 64 lift or lower the focus ring 5 with respect to the mounting surface 2e. The acquisition unit 111 acquires the gap information 131 indicating the gap dimension between the mounting surface 2e and the facing portion 51a of the jig 51 mounted on the mounting surface 6c. The measurement unit 112 lifts the focus ring 5 using the elevating mechanisms 64 in a state where the jig 51 is mounted on the mounting surface 6c and measures the lifted distance of the focus ring 5 from the mounting surface 2e when the upper surface of the focus ring 5 is in contact with the facing portion 51a of the jig 51. The thickness calculation unit 113 calculates the thickness of the focus ring 5 based on the gap dimension indicated by the acquired gap information 131 and the measured lifted distance of the focus ring 5. Accordingly, the plasma processing apparatus 10 can highly accurately measure the thickness of the focus ring 5 with a simple configuration.

In the plasma processing apparatus 10 according to the first embodiment, the gap dimension is predetermined based on the distance between the mounting surface 2e and the mounting surface 6c and the distance between the mounting surface 6c and the facing portion 51a of the jig 51 mounted on the mounting surface 6c. Accordingly, the plasma processing apparatus 10 can highly accurately measure the thickness of the focus ring 5 even when the mounting table 2 or the jig 51 has dimensional errors.

In the plasma processing apparatus 10 according to the first embodiment, the mounting table 2 is provided with the jig 51 mounted on the mounting surface 6c or the electrostatic chuck 6 for attracting and holding the wafer W. The measurement unit 112 lifts the focus ring 5 using the elevating mechanism 64 in a state where the jig 51 is mounted on the mounting surface 6c and attracted and held by the electrostatic chuck 6. Accordingly, the plasma processing apparatus 10 can prevent the jig 51 from being separated from the mounting surface 6c when the upper surface of the focus ring 5 becomes in contact with the facing portion 51a of the jig 51, which makes it possible to highly accurately measure the thickness of the focus ring 5.

In the plasma processing apparatus 10 according to the first embodiment, the elevating mechanisms 64 are provided at multiple locations in the circumferential direction of the focus ring 5. The measurement unit 112 lifts the focus ring 5 using the elevating mechanisms 64 arranged at multiple locations in the circumferential direction of the focus ring 5. The measurement unit 112 measures the lifted distance of the focus ring 5 from the mounting surface 2e at the multiple locations in the circumferential direction of the focus ring 5 when the upper surface of the focus ring 5 is in contact with the facing portion 51a of the jig 51. The thickness calculation unit 113 calculates the thickness of the focus ring 5 at the multiple locations in the circumferential direction of the focus ring 5 based on the gap dimension indicated by the acquired gap information and the measured lifted distance of the focus ring 5. Accordingly, the plasma processing apparatus 10 can highly accurately measure the thickness of the focus ring 5 at the multiple locations in the circumferential direction of the focus ring 5.

The plasma processing apparatus 10 according to the first embodiment further includes an elevation control unit 114 for individually controlling the elevating mechanisms 64 such that the upper surface of the focus ring 5 is maintained at a given height based on the calculated thickness of the focus ring 5. Therefore, in the plasma processing apparatus 10, the upper surface of the focus ring 5 can be aligned with the upper surface of the wafer W in the circumferential direction. Accordingly, the plasma processing apparatus 10 can maintain the uniformity of the etching characteristics in the circumferential direction.

The plasma processing apparatus 10 according to the first embodiment further includes the alerting unit 115 for performing alerting based on the calculated thickness of the focus ring 5. Accordingly, the plasma processing apparatus 10 can notify the abnormality when the thickness of the focus ring 5 is reduced and the replacement of the focus ring 5 is required.

Second Embodiment

Next, a second embodiment will be described. The plasma processing apparatus 10 according to the second embodiment has the same configuration as that of the plasma processing apparatus 10 according to the first embodiment shown in FIGS. 1 and 2. Therefore, redundant description thereof will be omitted.

Figure 8:
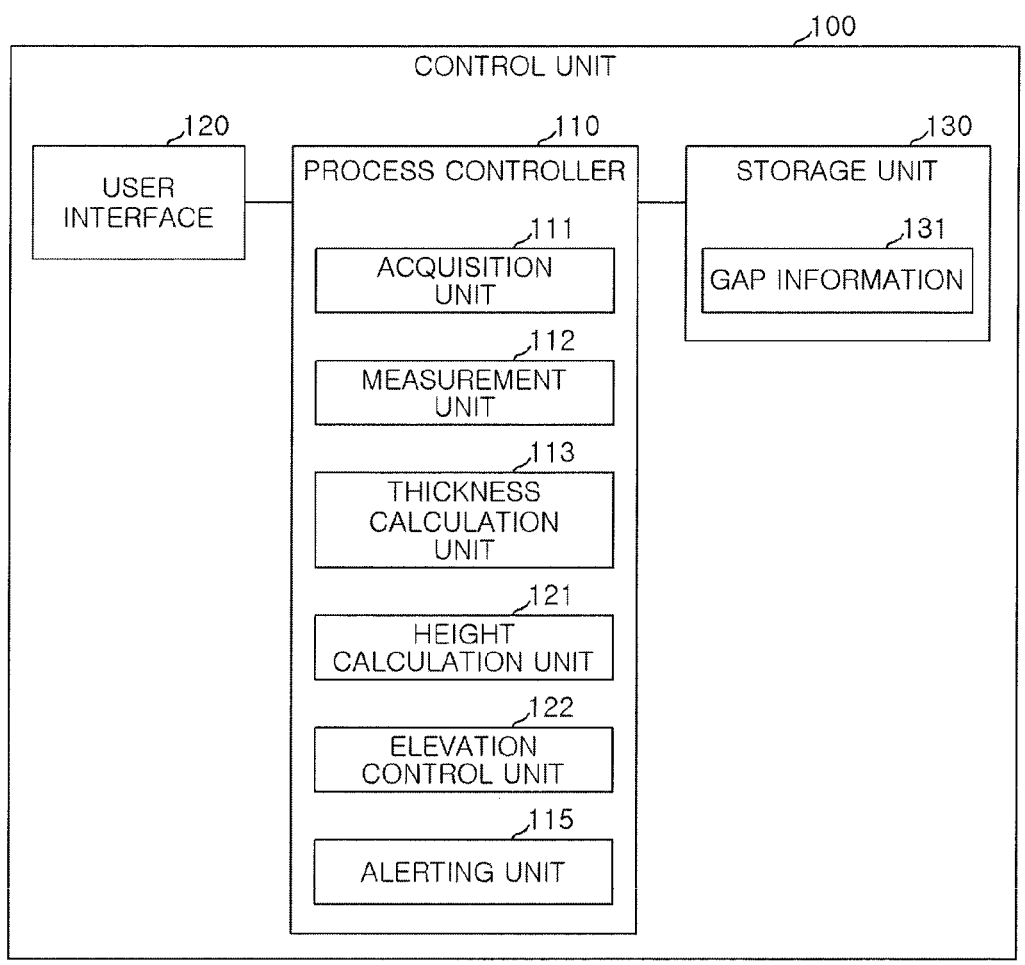
FIG. 8 is a block diagram showing a schematic configuration of a control unit for controlling a plasma processing apparatus according to a second embodiment.

Next, the control unit 100 according to the second embodiment will be described in detail. FIG. 8 is a block diagram showing a schematic configuration of the control unit 100 for controlling the plasma processing apparatus 10 according to the second embodiment. The control unit 100 according to the second embodiment has substantially the same configuration as that of the control unit 100 according to the first embodiment shown in FIG. 3. Therefore, like reference numerals will be used for like parts, and redundant description thereof will be omitted.

The process controller 110 includes a height calculation unit 121 and an elevation control unit 122, instead of the elevation control unit 114 shown in FIG. 3.

The height calculation unit 121 calculates the height of the ring 5 at which the positional relationship between the upper surface of the wafer W and the upper surface of the focus ring 5 satisfies a predetermined gap based on the thickness of the focus ring 5 calculated by the thickness calculation unit 113. For example, the conditions for the positional relationship between the upper surface of the wafer W and the upper surface of the focus ring 5 which allows the angle of the hole formed in the wafer W by etching to be within a given allowable range are previously obtained by performing a test or the like. The conditions for the positional relationship between the upper surface of the wafer W and the upper surface of the focus ring 5 may be stored as condition information in the storage unit 130. The height calculation unit 121 may read out the conditions for the positional relationship from the condition information. Further, the conditions for the positional relationship between the upper surface of the wafer W and the upper surface of the focus ring 5 may be determined depending on etching conditions such as an etching gas, a material of the wafer W, and the like, and stored as the condition information. The height calculation unit 21 may read out the conditions for the positional relationship corresponding to the etching conditions to be applied from the condition information. In the present embodiment, when the height of the upper surface of the wafer W is equal to the height of the upper surface of the focus ring 5, the angle of the hole formed in the wafer W by etching is within the allowable range. In this case, the height calculation unit 121 calculates the height of the focus ring 5 at which the height of the upper surface of the wafer W becomes equal to the height of the upper surface of the focus ring 5. Further, the height calculation unit 121 calculates the height of the focus ring 5 at which the height of the upper surface of the wafer W becomes equal to the height of the upper surface of the focus ring 5 at the multiple locations in the circumferential direction of the wafer W where the elevating mechanisms 64 are disposed.

The elevation control unit 122 controls the elevating mechanisms 64 to lift or lower the lifter pins 64 to the height calculated by the height calculating unit 121, thereby lifting or lowering the focus ring 5. For example, the elevation control unit 122 controls the elevating mechanisms 64 to lift or lower the focus ring 5 to the height calculated by the height calculation unit 121 at the locations where the elevating mechanisms 64 are disposed.

As described above, the plasma processing apparatus 10 according to the second embodiment includes the height calculation unit 121 and the elevation control unit 122. The height calculation unit 121 calculates the height of the focus ring 5 at which the positional relationship between the upper surface of the wafer W and the upper surface of the focus ring 5 satisfies a predetermined gap based on the calculated thickness of the focus ring 5. The elevation control unit 122 controls the elevating mechanisms 64 such that the focus ring 5 reaches the calculated height. Therefore, in the plasma processing apparatus 10, the upper surface of the focus ring 5 can be aligned with the upper surface of the wafer W in the circumferential direction. Accordingly, the plasma processing apparatus 10 can maintain the uniformity of the etching characteristics in the circumferential direction.

Although various embodiments have been described above, the present disclosure can be variously modified without being limited to the above-described embodiments. For example, the above-described plasma processing apparatus 10 is a capacitively coupled plasma processing apparatus 10. However, it is also possible to employ any plasma processing apparatus 10. For example, the plasma processing apparatus 10 may be any type of plasma processing apparatus 10 such as an inductively coupled plasma processing apparatus 10 or a plasma processing apparatus 10 for exciting a gas by surface waves such as microwaves.

In the above-described embodiments, the case of measuring a thickness of the focus ring 5 disposed around the wafer W has been described as an example. However, the present disclosure is not limited thereto. For example, when another ring member such as a cover ring or the like is disposed around the focus ring 5, a thickness of another ring member may be measured in the same manner as that used in the process of measuring a thickness of the focus ring 5 according to the above-described embodiments.

In the above-described embodiments, the case in which the "gap dimension" is predetermined based on the distance between the mounting surface 2e and the mounting surface 6c and the distance between the mounting surface 6c and the facing portion 51a of the jig 51 mounted on the mounting surface 6c has been described as an example. However, the present disclosure is not limited thereto. For example, the plasma processing apparatus 10 may measure the gap dimension between the mounting surface 2e on which the focus ring 5 is not mounted and the facing portion 51a of the jig 51 mounted on the mounting surface 6c using the jig 51 mounted on the mounting surface 6c. For example, in the plasma processing apparatus 10, the lifter pins 63 are lifted by the elevating mechanisms 64 in a state where the focus ring 5 is not mounted on the mounting surface 2e and the jig 51 is mounted on the mounting surface 6c and attracted and held by the electrostatic chuck 6. In the plasma processing apparatus 10, when the tip ends of the lifter pins 63 are in contact with the facing portion 51a of the jig 51, the lifted distance "$s_4$" of the tip ends of the lifter pins 63 from the mounting surface 2e is measured and the gap dimension between the mounting surface 2e and the facing portion 51a of the jig 51 mounted on the mounting surface 6c is specified.

FIGS. 9A and 9B explain exemplary flow of the process of measuring the gap dimension using the jig 51. FIG. 9A shows a state where the focus ring 5 is not mounted on the mounting surface 2e and the jig 51 is mounted on the mounting surface 6c. The jig 51 is attracted and held by the electrostatic chuck 6. The heights of the lifter pins 63 are adjusted such that the tip ends of the lifter pins 63 are positioned on the same plane as the mounting surface 2e. In the plasma processing apparatus 10, the lifter pins 63 are lifted by the elevating mechanisms 64 until the tip ends of the lifter pins 63 become in contact with the facing portion 51a of the jig 51. FIG. 9B shows a state where the tip ends of the lifter pins 63 are in contact with the facing portion 51a of the jig 51. In the example of FIG. 9B, the tip ends of the lifter pins 63 are lifted from the mounting surface 2e by "$s_4$". As shown in FIG. 9B, the plasma processing apparatus 10 measures the lifted distance "$s_4$" of the tip ends of the lifter pins 63 from the mounting surface 2e when the tip ends of the lifter pins 63 are in contact with the facing portion 51a of the jig 51. In the plasma processing apparatus 10, the lifted distance "$s_4$" is measured as the gap dimension "$t_1+t_2$" between the mounting surface 2e and the facing portion 51a of the jig 51 mounted on the mounting surface 6c. By measuring the gap dimension using the jig 51 mounted on the mounting surface 6c, the accurate gap dimension can be obtained even when the actual dimensions of the mounting table 2 change due to thermal expansion or contraction caused by heating or cooling the mounting table 2.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
    a mounting table having a first mounting surface on which a target object or a jig is mounted and a second mounting surface on which a ring member is mounted, the jig being used for measuring a thickness of the ring member disposed around the target object and having a facing portion facing an upper surface of the ring member, the first mounting table including an electrostatic chuck configured to hold the target object or the jig by electrostatic force;
    one or more elevating mechanisms configured to lift or lower the ring member with respect to the second mounting surface; and
    a controller comprising:
        an acquisition unit configured to acquire gap information indicating a gap dimension between the second mounting surface and the facing portion of the jig mounted on the first mounting surface;
        a measurement unit configured to measure a lifted distance of the ring member from the second mounting surface when the upper surface of the ring member is in contact with the facing portion of the jig mounted on the first mounting surface by controlling lifting of the ring member by using the one or more elevating mechanisms and receiving sensed information from at least one sensor provided on the one or more elevating mechanisms, the measurement unit further configured to determine when the facing portion of the jig contacts the ring member while the jig is held by electrostatic force of the electrostatic chuck based on the sensed information; and a thickness calculation unit configured to calculate the thickness of the ring member based on the gap dimension and the measured lifted distance of the ring member, wherein the controller is configured to control the apparatus to apply the electrostatic force by the electrostatic chuck to hold the jig to the first mounting surface during lifting of the ring member by the one or more elevating mechanisms and when the measurement unit determines the facing portion of the jig contacts the ring member.

2. The plasma processing apparatus of claim 1, wherein the gap dimension is predetermined based on a distance between the second mounting surface and the first mounting surface and a distance between the first mounting surface and the facing portion of the jig mounted on the first mounting surface.

3. The plasma processing apparatus of claim 1, wherein the ring member includes a body portion and a protruding portion projecting radially inward from an inner side surface of the body portion, an upper surface of the protruding portion being lower than an upper surface of the body portion, the facing portion of the jig faces the body portion and the protruding portion in a state where the jig is mounted on the first mounting surface, the measurement unit measures the lifted distance of the ring member from the second mounting surface when the upper surface of the body portion is in contact with the facing portion of the jig, and the thickness calculation unit calculates a thickness of the body portion based on the gap dimension and the measured lifted distance of the ring member.

4. The plasma processing apparatus of claim 1, wherein the ring member includes a body portion and a protruding portion projecting radially inward from an inner side surface of the body portion, an upper surface of the protruding portion being lower than an upper surface of the body portion, the facing portion of the jig faces the protruding portion in a state where the jig is mounted on the first mounting surface, the measurement unit measures the lifted distance of the ring member from the second mounting surface when the upper surface of the protruding portion is in contact with the facing portion of the jig, and the thickness calculation unit calculates a thickness of the protruding portion based on the gap dimension and the measured lifted distance of the ring member.

5. The plasma processing apparatus of claim 1, wherein the ring member includes a body portion and a protruding portion projecting radially inward from an inner side surface of the body portion, an upper surface of the protruding portion being lower than an upper surface of the body portion, the facing portion of the jig is curved toward a boundary portion between the body portion and the protruding portion in a state where the jig is mounted on the first mounting surface, the measurement unit measures the lifted distance of the ring member from the second mounting surface when an upper surface of the boundary portion is in contact with the facing portion of the jig, and the thickness calculation unit calculates a thickness of the boundary portion based on the gap dimension and the measured lifted distance of the ring member.

6. The plasma processing apparatus of claim 1, wherein the one or more elevating mechanisms comprise plural elevating mechanisms arranged at multiple locations in a circumferential direction of the ring member, the measurement unit measures the lifted distance of the ring member from the second mounting surface at the multiple locations when the upper surface of the ring member is in contact with the facing portion of the jig by lifting the ring member by using the elevating mechanisms, and the thickness calculation unit calculates a thickness of the ring member at the multiple locations based on the gap dimension and the measured lifted distance of the ring member.

7. The plasma processing apparatus of claim 6, wherein:

the controller comprises an elevation control unit configured to individually control the elevating mechanisms based on the calculated thickness of the ring member such that the upper surface of the ring member is maintained at a given height.

8. The plasma processing apparatus of claim 1, wherein the controller further comprises:

a height calculation unit configured to calculate a height of the ring member at which positional relationship between the upper surface of the target object and the upper surface of the ring member satisfies a predetermined gap based on the calculated thickness of the ring member; and an elevation control unit configured to control one or more the elevating mechanisms such that the ring member reaches the calculated height.

9. The plasma processing apparatus of claim 1, wherein:

the controller comprises an alerting unit configured to perform alerting based on the calculated thickness of the ring member.

10. A method for measuring a thickness of a ring member mounted on a mounting table having a first mounting surface on which a target object or a jig is mounted and a second mounting surface on which the ring member disposed around the target object is mounted, the first mounting surface including an electrostatic chuck, comprising:

acquiring gap information indicating a gap dimension between a facing portion of the jig mounted on the first mounting surface and the second mounting surface, the jig being used for measuring the thickness of the ring member, the facing portion facing an upper surface of the ring member;

lifting the ring member using one or more elevating mechanisms configured to lift or lower the ring member with respect to the second mounting surface in a state where the jig is mounted on the first mounting surface and the jig is held on the first mounting surface by electrostatic force of the electrostatic chuck;

measuring a lifted distance of the ring member from the second mounting surface when the upper surface of the ring member is in contact with the facing portion of the jig, the measuring including lifting the ring member with the one or more elevating mechanisms while the jig is held on the first mounting surface by electrostatic force and determining when the ring member contacts the facing portion of the jig while the jig is held by the electrostatic force to the first mounting surface and sensed information is provided by at least one sensor provided on the one or more elevating mechanisms; and calculating a thickness of the ring member based on the gap dimension and the measured lifted distance of the ring member.

11. The plasma processing apparatus of claim 1, wherein the ring member includes a body portion and a protruding portion projecting radially inward from an inner side surface of the body portion, an upper surface of the protruding portion being lower than an upper surface of the body portion.

12. The apparatus of claim 11, wherein a height of the upper surface of the body portion is higher than a height of the first mounting surface, and a height of the upper surface of the protruding portion is lower than the height of the first mounting surface.

13. The plasma processing apparatus of claim 1, wherein the facing portion of the jig faces the ring member in a state where the jig is mounted on the first mounting surface.

14. The plasma processing apparatus of claim 1, wherein the measurement unit measures the lifted distance of the ring member from the second mounting surface when a portion of the upper surface of the ring member is in contact with the facing portion of the jig.

15. The plasma processing apparatus of claim 1, wherein the thickness calculation unit calculates a thickness of a portion of the ring member based on the gap dimension and the measured lifted distance of the ring member.

16. The plasma processing apparatus of claim 1, wherein the thickness calculation unit calculates a thickness of the ring member by subtracting the measured lifted distance of the ring member from the gap dimension.

17. The plasma processing apparatus of claim 1, wherein the jig includes a conductive material.

18. The plasma processing apparatus according to claim 1, wherein the at least one sensor includes at least one torque sensor which provides torque information to the controller, and contact between the ring member and the facing portion is determined by comparing sensed torque information with a threshold value while the jig is held by the electrostatic force.

* * * * *